(12) United States Patent
Cotorogea et al.

(10) Patent No.: US 10,680,089 B2
(45) Date of Patent: Jun. 9, 2020

(54) SEMICONDUCTOR DEVICE HAVING AN ACTIVE TRENCH AND A BODY TRENCH

(71) Applicant: Infineon Technologies AG, Neubiberg (DE)

(72) Inventors: Maria Cotorogea, Taufkirchen (DE); Frank Wolter, Munich (DE); Hans-Joachim Schulze, Taufkirchen (DE); Franz-Josef Niedernostheide, Hagen am Teutoburger Wald (DE); Yvonne Gawlina-Schmidl, Pullach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/456,895

(22) Filed: Jun. 28, 2019

(65) Prior Publication Data
US 2019/0319123 A1    Oct. 17, 2019

Related U.S. Application Data

(63) Continuation of application No. 16/189,279, filed on Nov. 13, 2018, now Pat. No. 10,388,776, which is a (Continued)

(51) Int. Cl.
| | | |
|---|---|---|
| *H01L 29/40* | (2006.01) | |
| *H01L 29/78* | (2006.01) | |
| *H01L 29/739* | (2006.01) | |
| *H01L 29/10* | (2006.01) | |
| *H01L 29/06* | (2006.01) | |
| *H01L 29/08* | (2006.01) | |
| *H01L 27/115* | (2017.01) | |
| *H01L 27/105* | (2006.01) | |
| *H01L 27/11521* | (2017.01) | |

(52) U.S. Cl.
CPC ...... *H01L 29/7397* (2013.01); *H01L 29/0623* (2013.01); *H01L 29/0834* (2013.01); *H01L 29/1095* (2013.01); *H01L 29/407* (2013.01); *H01L 29/7395* (2013.01); *H01L 29/7813* (2013.01); *H01L 27/105* (2013.01); *H01L 27/115* (2013.01); *H01L 27/11521* (2013.01)

(58) Field of Classification Search
CPC ............ H01L 29/7397; H01L 29/0834; H01L 29/7395; H01L 29/7813; H01L 29/407; H01L 29/105
USPC ......... 257/139, 320, 330–334, 329; 438/270, 438/271, 587
See application file for complete search history.

(56) References Cited

U.S. PATENT DOCUMENTS

| | | |
|---|---|---|
| 5,623,152 A | 4/1997 | Majumdar et al. |
| 5,894,149 A | 4/1999 | Uenishi et al. |
| | (Continued) | |

FOREIGN PATENT DOCUMENTS

| | | |
|---|---|---|
| CN | 1447987 A | 10/2003 |
| DE | 102012222439 A1 | 6/2013 |
| JP | 2011199101 A | 10/2011 |

*Primary Examiner* — Thinh T Nguyen
(74) *Attorney, Agent, or Firm* — Murphy, Bilak & Homiller, PLLC

(57) ABSTRACT

A semiconductor device is described in which a conductive channel is present along an active gate trench of the device when a gate potential is at an on-voltage, whereas no conductive channel is present along an inactive gate trench of the device for the same gate potential condition.

24 Claims, 10 Drawing Sheets

Related U.S. Application Data continuation of application No. 15/594,269, filed on May 12, 2017, now Pat. No. 10,134,885, which is a continuation of application No. 14/824,388, filed on Aug. 12, 2015, now Pat. No. 9,680,005, which is a continuation of application No. 13/796,287, filed on Mar. 12, 2013, now Pat. No. 9,142,655.

(56) References Cited

U.S. PATENT DOCUMENTS

| | | |
|---|---|---|
| 6,818,947 B2 | 11/2004 | Grebs et al. |
| 6,833,584 B2 | 12/2004 | Henninger et al. |
| 7,345,342 B2 | 3/2008 | Challa et al. |
| 7,400,014 B2 | 7/2008 | Thapar |
| 7,928,505 B2 | 4/2011 | Hirao et al. |
| 8,264,033 B2 | 9/2012 | Pfirsch et al. |
| 8,853,774 B2 | 10/2014 | Cortorogea et al. |
| 9,059,256 B2 | 6/2015 | Meiser et al. |
| 9,231,100 B2 | 1/2016 | Meiser et al. |
| 2002/0185680 A1 | 12/2002 | Henninger et al. |
| 2003/0160270 A1* | 8/2003 | Pfirsch et al. ........ H01L 29/402 257/288 |
| 2006/0214222 A1 | 9/2006 | Challa et al. |
| 2007/0004116 A1 | 1/2007 | Hshieh |
| 2007/0040215 A1 | 2/2007 | Ma et al. |
| 2007/0108511 A1 | 5/2007 | Hirler |
| 2007/0290257 A1 | 12/2007 | Kraft et al. |
| 2008/0121986 A1 | 5/2008 | Hshieh |
| 2009/0140327 A1 | 6/2009 | Hirao et al. |
| 2009/0166720 A1 | 7/2009 | Zundel |
| 2011/0018029 A1 | 1/2011 | Pfirsch et al. |
| 2011/0037120 A1 | 2/2011 | Chen et al. |
| 2012/0043602 A1 | 2/2012 | Zeng et al. |
| 2013/0020635 A1 | 1/2013 | Yilmaz et al. |

* cited by examiner

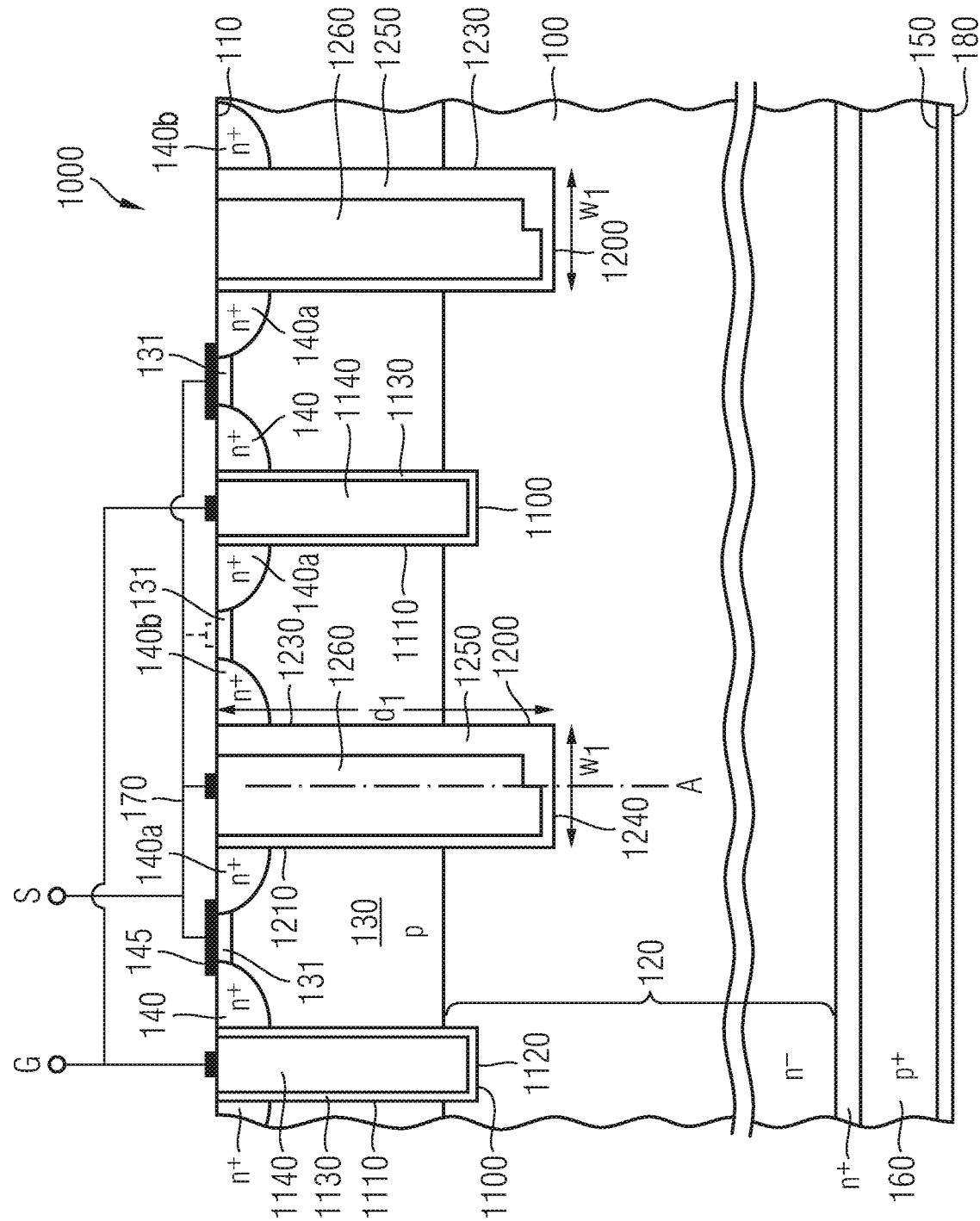

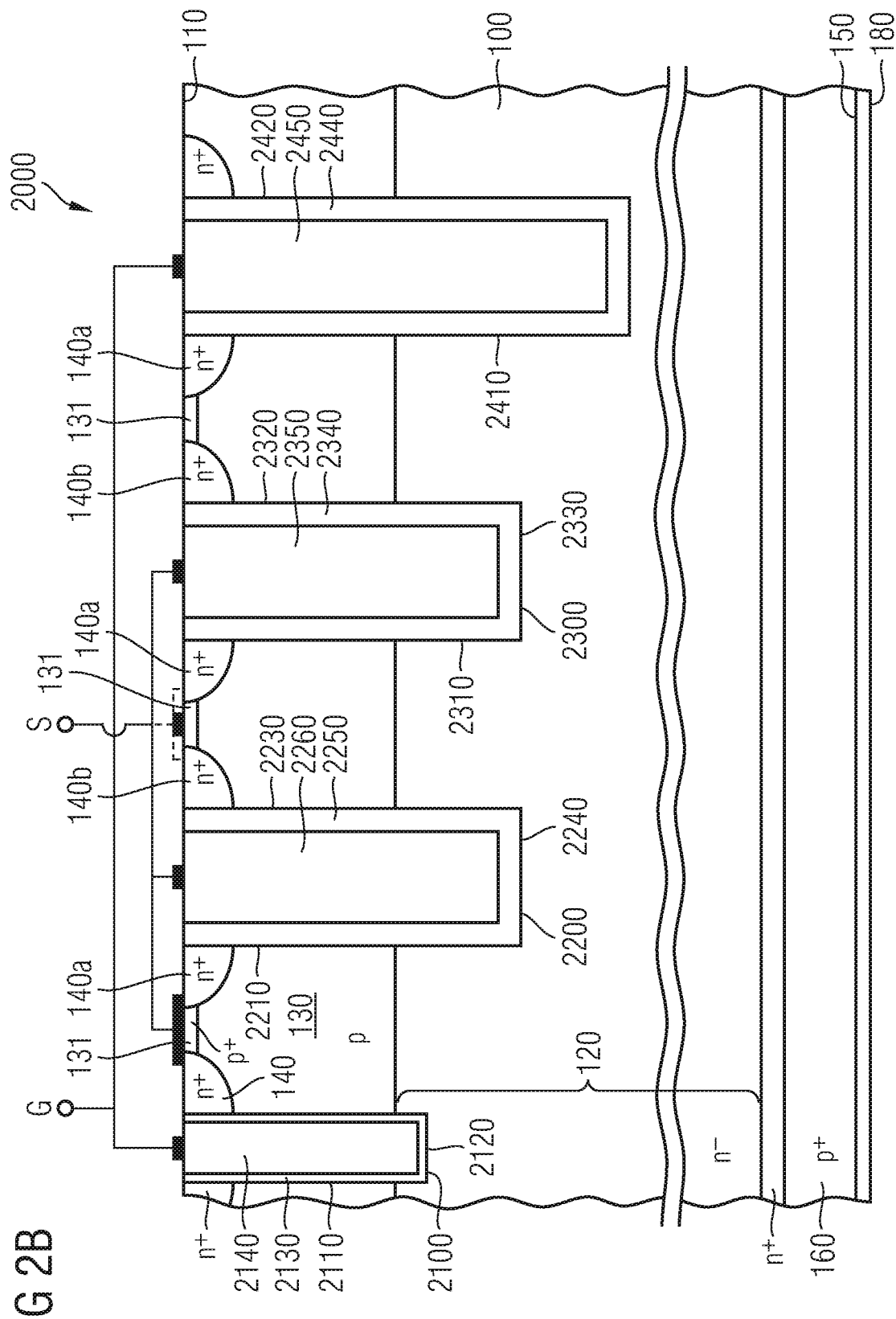

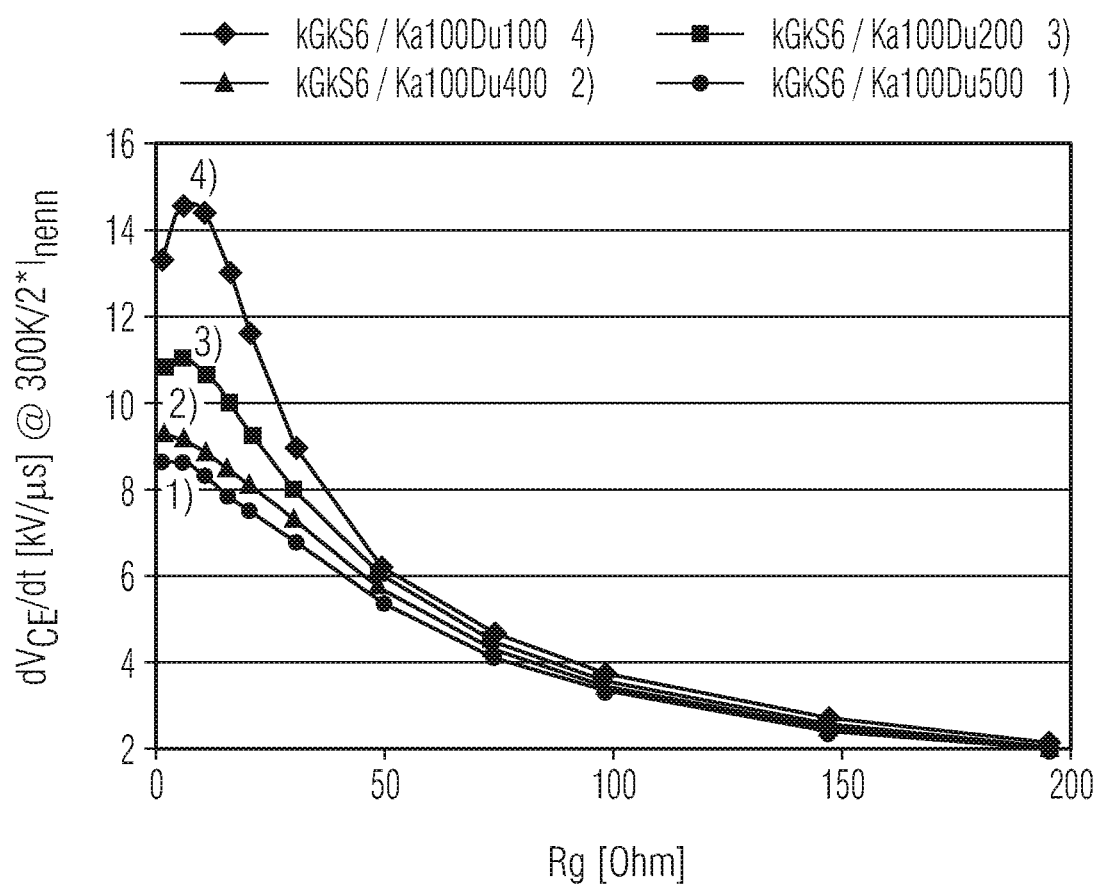

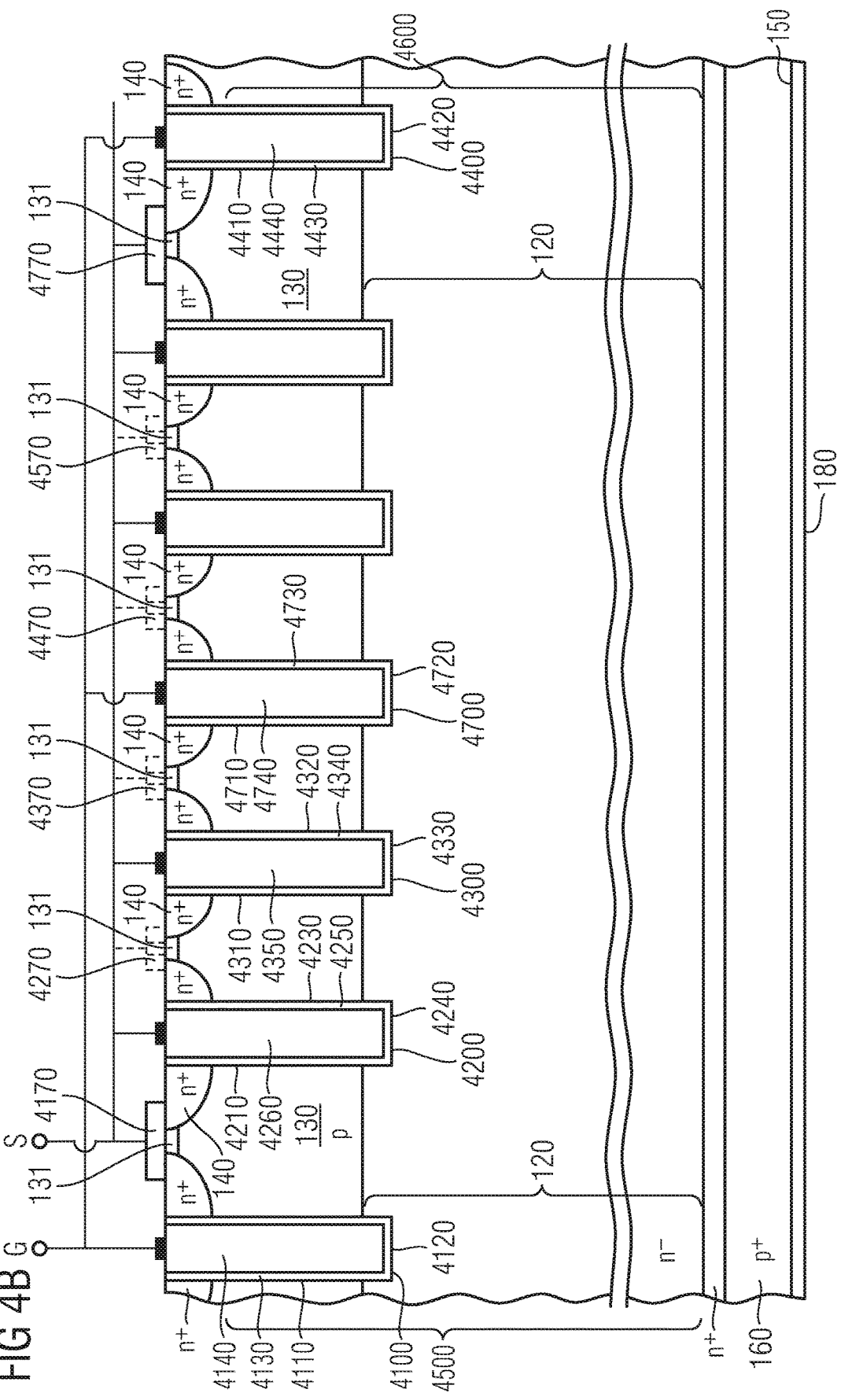

US 10,680,089 B2

SEMICONDUCTOR DEVICE HAVING AN ACTIVE TRENCH AND A BODY TRENCH

BACKGROUND

Semiconductor devices such as field effect transistors (FETs) and insulated gate bipolar transistor (IGBTs) are widely used in a broad field, e.g. automotive and industrial applications.

It is desirable to provide a semiconductor device having reduced switching and conducting losses, improved electrical characteristics and an improved SOA (safe operation area).

SUMMARY

According to an embodiment, a semiconductor device in a semiconductor substrate including a first main surface includes a transistor cell. The transistor cell includes a drift region of a first conductivity type, a body region of a second conductivity type between the drift region and the first main surface, an active trench at the first main surface extending into the drift region, a gate insulating layer at sidewalls and at a bottom side of the active trench, a gate conductive layer in the active trench, and a source region of the first conductivity type in the body region adjacent the active trench. The transistor cell further includes a body trench at the first main surface extending into the drift region, the body trench being adjacent to the body region and to the drift region, an insulating layer at sidewalls and at a bottom side of the body trench, the insulating layer being asymmetric with respect to an axis extending perpendicular to the first main surface at a center of the body trench, and a conductive layer in the body trench.

According to an embodiment, a semiconductor device in a semiconductor substrate including a first main surface includes a transistor cell. The transistor cell comprises a drift region of a first conductivity type, a body region of a second conductivity type between the drift region and the first main surface, an active trench at the first main surface extending into the drift region, a gate insulating layer at sidewalls and at a bottom side of the active trench, a gate conductive layer in the active trench, and a source region of the first conductivity type in the body region adjacent to the active trench. The transistor cell further comprises a first body trench at the first main surface extending into the drift region, the body trench being adjacent to the body region and to the drift region, an insulating layer at sidewalls and at a bottom side of the body trench, the insulating layer having a larger thickness than a thickness of the gate insulating layer, and a conductive layer in the body trench.

According to a further embodiment, a semiconductor device in a semiconductor substrate including a first main surface includes a transistor cell. The transistor cell comprises a drift region of a first conductivity type, a body region of a second conductivity type between the drift region and the first main surface, an active trench at the first main surface extending into the drift region, a gate conductive layer in the active trench, and a source region of the first conductivity type in the body region adjacent to the active trench. The transistor cell comprises at least a first body trench and a second body trench at the first main surface extending into the drift region, the first and second body trenches being adjacent to the body region and to the drift region, further source regions of the first conductivity type in the body region adjacent to at least one of the first and the second body trenches, at least one of the further source regions being disconnected from a source terminal, an insulating layer at sidewalls and at a bottom side of each of the first and second body trenches, and a conductive layer in each of the first and second body trenches. At least one of the first and second body trenches is different from the active trench.

According to an embodiment, a semiconductor device in a semiconductor substrate including a first main surface includes a transistor cell. The transistor cell comprises a drift region of a first conductivity type, a body region of a second conductivity type, between the drift region and the first main surface, an active trench at the first main surface extending into the drift region, a gate conductive layer being disposed in the active trench, and a source region of the first conductivity type in the body region adjacent to the active trench. The transistor cell comprises at least a first body trench and a second body trench at the first main surface extending into the drift region, the first and second body trenches being adjacent to the body region and to the drift region, an insulating layer at sidewalls and at a bottom side of each of the first and second body trenches, and a conductive layer in each of the first and second body trenches. The first and the second body trenches are different from each other.

According to an embodiment, a semiconductor device formed in a semiconductor substrate including a first main surface, comprises a drift region of a first conductivity type, a body region of a second conductivity type, the body region being disposed between the drift region and the first main surface, a first transistor cell and a second transistor cell. Each of the first and second transistor cells comprises an active trench at the first main surface and extending into the drift region, a gate conductive layer disposed in the active trench, and a source region formed in the body region adjacent to the active trench. The semiconductor device further comprises body trenches disposed between the first and the second transistor cells and further source regions, the body trenches being formed in the first main surface and extending into the drift region. The body trenches are adjacent to the body region and the drift region. A conductive material in at least one of the body trenches is connected with a gate terminal and at least one of the further source regions disposed between the body trenches is disconnected from a source terminal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1A and 1B illustrate examples of a cross-sectional view of a semiconductor device according to an embodiment;

FIG. 2B illustrates a cross-sectional view of a semiconductor device according to a further embodiment;

FIGS. 3A, 3B and 3C show simulation results of the embodiments illustrated in FIGS. 1 and 2A;

FIGS. 4A and 4B show cross-sectional view of a semiconductor device according to a further embodiment.

DETAILED DESCRIPTION

Figure 1B:
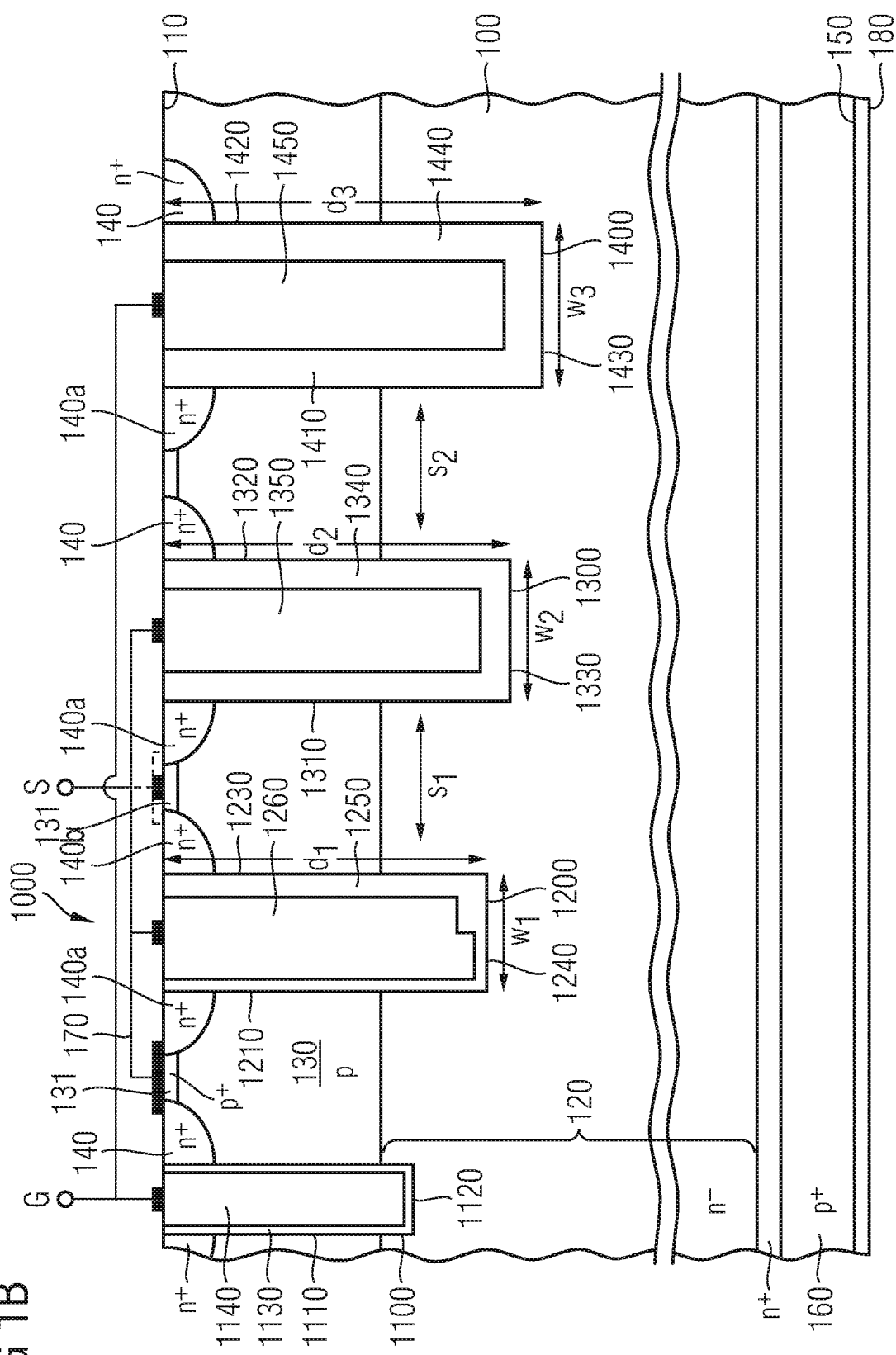

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material. According to an embodiment, the term "semiconductor substrate" may comprise a suitable semiconductor carrier including epitaxial semiconductor layers.

The term "vertical" as used in this specification intends to describe an orientation which is arranged perpendicular to the first surface of the semiconductor substrate or semiconductor body.

The terms "lateral" and "horizontal" as used in this specification intend to describe an orientation parallel to a first surface of a semiconductor substrate or semiconductor body. This can be for instance the surface of a wafer or a die.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIG. 1A illustrates a cross-sectional view of a semiconductor device according to an embodiment. The semiconductor device 1000 shown in FIG. 1A is formed in semiconductor substrate 100 and includes a first main surface 110 and a second main surface 150, the second main surface 150 disposed on an opposite side of the semiconductor substrate, opposite from the first main surface 110. A source region 140 of a first conductivity type is disposed adjacent to the first main surface 110. The source region 140 is formed in a body region 130 of a second conductivity type. A drift zone 120 is disposed in a lower portion of the semiconductor substrate. The drift zone 120 may be doped with the first conductivity type and, for example, comprise a portion of a lower impurity concentration (n−) and a portion of a higher impurity concentration (n+). A back side region 160 of the second conductivity type is disposed adjacent to the second main surface 150.

The semiconductor device 1000 comprises a transistor cell that includes the drift zone 120, the body region 130, the source region 140 and the back side region 160. The transistor cell further comprises an active trench 1100 that is formed in the first main surface 110 and extends to the drift region 120. A dielectric layer 1130 may be disposed adjacent to sidewalls 1110 and the bottom side 1120 of the active trench 1100. Further, a conductive material 1140 may be disposed in the active trench 1100. The transistor cell further comprises a body trench 1200 that is formed in a first main surface 110 and that extends to the drift region 120. The body trench 1200 extends across the body region 130 to the drift region 120. The body trench 1200 is adjacent to the body region 130 and the drift region 120. An insulating layer 1250 is disposed adjacent to sidewall 1210, 1230 and at a bottom side 1240 of the body trench 1200. Further, a conductive layer 1260 is disposed in the body trench 1200. The insulating layer 1250 may be disposed so as to insulate the conductive layer 1260 from the substrate material. As is shown in FIG. 1A, several or a plurality of transistor cells may be disposed adjacent to each other. The transistor cells may be connected in parallel to each other to form a transistor cell array.

The insulating layer 1250 is asymmetric with respect to an axis A that extends perpendicular with respect to the first main surface 110 and is disposed at a middle position or center of the body trench 1200. According to an embodiment, this feature may mean that the insulating layer 1250 has an asymmetric shape with respect to axis A. For example, as is shown in FIG. 1A, the insulating layer 1250 has a different shape on the right-hand side of the body trench 1200 then on the left-hand side of the body trench. Accordingly, insulating layer 1250 has an asymmetric shape with respect to a middle-axis A that extends perpendicularly with respect to the main surface and is disposed at a middle position of the body trench. The middle axis forms a plane that extends perpendicular to a line connecting the active trench 1100 and the body trench 1200. For example, the insulating layer 1250 may have a larger thickness on the right-hand side of the trench than on the left-hand side. To be more specific, at a position close to the active trench 1100, the layer thickness of the dielectric layer 1250 is decreased with respect to a side remote from the active trench 1100. According to a further embodiment, the feature that the insulating layer is asymmetric with respect to the middle axis may mean that the body trench 1200 has an asymmetric shape. For example, a side of the body trench 1200 adjacent to the active trench 1100 may extend to a smaller depth than the side of the body trench that is remote from the active trench 1100.

As is illustrated in FIG. 1A, at a bottom side 1240 of the trench, the dielectric layer 1250 may have a step-like shape so that the thickness of the dielectric layer 1250 increases from a position close to the active trench 1100 to a position remote from the active trench 1100. According to an embodiment, the thickness of the dielectric layer 1250 may be about 100 nm on a side facing the active trench 1100 and may be about 300 nm on a side remote from the active trench 1100.

The body trench 1200 may have a width $w_1$ and a depth $d_1$. The width $w_1$ of the body trench 1200 may be different from a width of the gate trench 1100. For example, the width $w_1$ may be larger than the width of the active trench 1100. Further, the depth $d_1$ of the trench 1200 may be larger than the depth of the active trench 1100.

According to a further embodiment, the asymmetric feature of the insulating layer may mean that, for example, the insulating layer has a composition and, thus, dielectric constant on a side closer to the active trench 1100 different from a composition and, thus, dielectric constant on a side remote from the active trench 1100. According to a further embodiment, this feature may mean, that fixed charges comprising, for example, ions of Cs or Al, may be disposed in an asymmetrical manner in the body trench 1200. For example, the number or kind of fixed charges may be different between a sidewall adjacent to the active trench 1100 and a sidewall remote from the active trench 1100.

The source portion 140 is connected via a source electrode 145 to a source potential. A back side electrode 180 is disposed in contact with the back side region 160. The conductive material 1260 inside the body trench 1200 may be connected via a conductive line 170 with the source potential. According to the embodiment shown in FIG. 1A, the body region 130 may be connected to source potential. Optionally, a body contact region 131 may be disposed between the body region and the electrode for connecting with source potential. The body contact region 131 may be heavily doped with the second conductivity type. One or two source regions 140a, 140b may be disposed at one or two sides of the body trench. For example, the source region 140a at the left-hand side of the body trench 1200 may be connected with the source terminal. According to a further example, the source region 140b at the right-hand side of the body trench 1200 may be connected with the source terminal. The body trench 1200 may be distinguished from the active trench due to the different terminal that is connected to the conductive material 1140 disposed in the active trench 1100 compared with the terminal that is connected to the conductive material 1260 that is disposed in the body trench 1200.

When a predetermined voltage $V_{ce}$ is applied between the back side electrode 180 and the source electrode 145, and a predetermined voltage $V_g$ is applied between the gate electrode 1140 and the source electrode 145, that is, when the gate is turned on, a conductive channel is formed in the body region 130 at a portion adjacent to the gate electrode 1140. When the conductive channel is formed, electrons flow from the source region 140 to the drift region 120. The electrons cause a forward bias between the back side region 160 and the drift region 120, and holes move from the back side electrode via the back side region 160 and, optionally, the $n^+$-layer into the drift region 120. This results in a great reduction of resistance of the drift region 120 due to conductivity modulation, increasing the current capacity of the IGBT. A voltage drop between the back side electrode 180 and the source electrode 145 of the IGBT at this time is referred to as an on-state voltage ($V_{ce}$(sat)).

When the gate is turned off, i.e. a gate voltage $V_{ge}$ between the gate electrode 1140 and the source region 140 is reduced to zero or reverse-biased, no channel region as formed in the body region 130. Accordingly, the flow of electrons from the source region 140 stops. Thereafter, the electrons and holes accumulated in the drift region 120 either move to the back side region 160 and source region 140, respectively, or recombine to disappear.

Generally, there is a trade-off between the on-resistance of the IGBT, which is mainly determined by the resistance of the drift region 120, and the breakdown voltage.

In a semiconductor device illustrated in FIG. 1A, a gate-feedback can be decreased due to the presence of the specific body trenches 1200 in which the insulating layer has the asymmetric shape. As a consequence, a maximum gradient of the current $dI_c/dt$ may be better controlled by setting a corresponding gate resistance.

FIG. 1B shows a semiconductor device according to a further embodiment. As is shown, the semiconductor device 1000 of the embodiment illustrated in FIG. 1B is similar to the semiconductor device illustrated in FIG. 1A. Further, the semiconductor device 1000 of FIG. 1B includes a second and a third body trench 1300, 1400. The body trenches 1300 and 1400 are formed in the first main surface 110 of the semiconductor substrate 100. For example, the second body trench 1300 may extend to a depth $d_2$ and may have a width $w_2$. According to an embodiment, $d_2$ may be different from $d_1$, for example, $d_2$ may be greater than $d_1$. Moreover, $w_2$ may be different from $w_1$, for example, $w_2$ may be greater than $w_1$. A dielectric layer 1340 is disposed adjacent to the sidewalls 1310, 1320 and the bottom side 1330 of the second trench 1300. Further, the second body trench 1300 may be filled with a conductive material 1350. For example, the dielectric layer 1340 may have a homogeneous shape. In other words, the thickness of the second dielectric layer 1340 may be equal at the first sidewall 1310, at the second sidewall 1320, and at the bottom side 1330. According to a further embodiment, the thicknesses of the dielectric layer 1340 may be different at the respective walls of the second body trench 1300.

The third body trench 1400 also comprises a dielectric layer 1440 and a conductive layer 1450. The dielectric layer 1440 may be homogeneous, for example, and may have an equal thickness at each of the sidewalls 1410, 1420 and at a bottom side 1430. Alternatively, the thicknesses of the dielectric layer 1440 may be variable. The distance between the first and the second body trenches 1200, 1300 $s_1$ may be different from a distance $s_2$ between the second body trench 1300 and the third body trench 1400. According to further embodiments, $s_1$ may be equal to $s_2$. According to an embodiment, the conductive filling of the body trenches 1300 and 1400 may be connected with source potential or with a gate potential. Further, the conductive filling of some of the body trenches may be connected to source potential, others being connected to the gate potential. As is, for example, illustrated in FIG. 1B, the conductive filling 1350 of the second body trench 1300 may be connected with source potential, and the conductive filling 1450 of the third body trench 1400 may be connected with the gate potential.

According to the embodiment of FIG. 1B, in addition to the first body trench having the configuration as described above with reference to FIG. 1A, further body trenches 1300, 1400 may be disposed in the first main surface 110. The transistor cell may comprise only a second body trench or a higher number of trenches than 3. The source region 140a that is disposed on the left-hand side of the first body trench 1200 may be connected with a source terminal. The source regions 140 disposed adjacent to the second and the further body trenches may not be connected with the source terminal. According to an embodiment, the second and the further body trenches 1300, 1400 are distinguished from the active trench 1100 by the feature that source regions adjacent to the second and the further body trenches 1300, 1400 are not connected to the source terminal so that the second and further body trenches are "inactive" trenches. According to a further embodiment, for example, the first and the second body trenches 1200, 1300 are distinguished from the active trench 1100, since the conductive material 1140 inside the active trench 1100 is connected with a gate terminal, whereas the conductive material 1260 within the first trench 1200 and the conductive material 1350 within the second trench 1300 is connected with the source terminal. According to an embodiment, the body region 130 between arbitrary body trenches may be connected with the source terminal, for example, by means of a further body contact region 131.

According to an embodiment, the second, third and, optionally further body trenches may have a similar structure as the first body trench. According to this embodiment, merely the insulating layer of the second, third and, optionally further body trenches is different from the insulating layer of the first body trench. According to this embodiment, the insulating layer of the second, third and, optionally further body trenches may have the same shape.

According to an embodiment, a first thickness of the insulating layer in the first body trench 1200 on a sidewall 1210 adjacent the active trench 1100 is different from a second thickness of the insulating layer in the first body trench 1200 on the sidewall 1230 remote from the active trench 1100. The first thickness is approximately equal to the thickness of the gate insulating layer 1130, and the second thickness is approximately equal to the thickness of the insulating layer 1340, 1440 in the additional body trenches 1300, 1400.

According to a further embodiment, the second, third, and, optionally further body trenches may have a structure different from the structure of the first body trench or may have a structure that is mutually different. According to the embodiment shown in FIG. 1B, the gate feedback in the semiconductor device may be further increased. As a consequence, a maximum gradient of the current $dI_c/dt$ may be better controlled by setting a corresponding gate resistance. Although not specifically illustrated in FIG. 1B, several or a plurality of transistor cells may be disposed adjacent to each other, in a similar manner as in FIG. 1A. The transistor cells may be connected parallel to each other to form a transistor cell array.

Figure 2A:
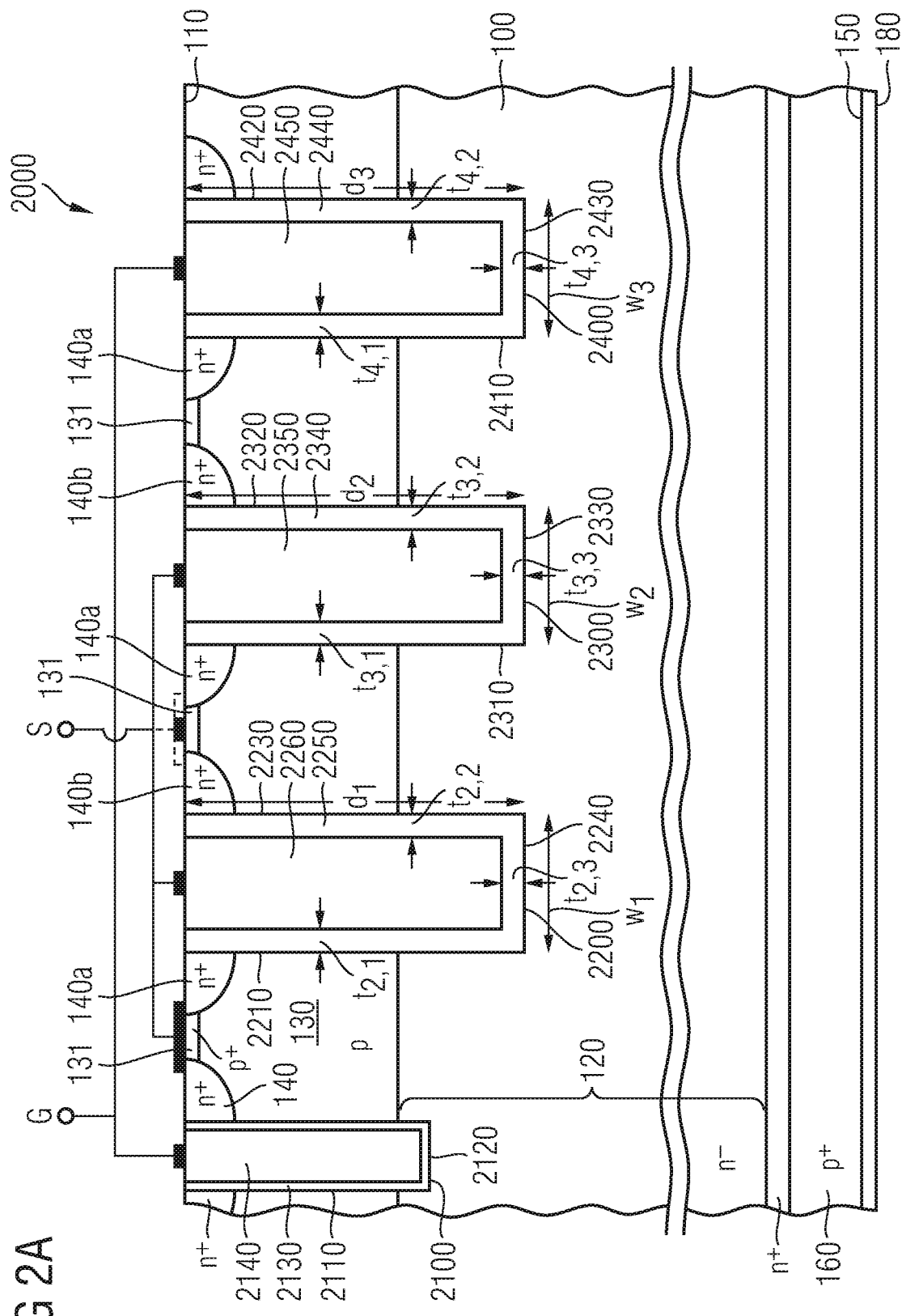
FIG. 2A illustrates a cross-sectional view of a semiconductor device according to a further embodiment.

As shown in FIG. 2A, an gate potential insulated gate bipolar transistor (IGBT) or semiconductor device 2000 according to an embodiment comprises a transistor cell, and the transistor cell includes a drift region 120 of a first conductivity type, a body region 130 of a second conductivity type, the body region 130 being disposed between the drift region 120 and the first main surface 110. The transistor cell comprises an active trench 2100 that is formed in the first main surface 110 and that extends to the drift region 120, a gate conductive layer 1140 being disposed in the active trench 2100. The transistor cell further comprises a source region 140 of the first conductivity type, formed in the body region 130 adjacent to the active trench 2100. The transistor cell further comprises at least a first and a second body trench 2200, 2300 and, optionally, a third trench 2400 or even more body trenches formed in the first main surface 110 and extending to the drift region 120. The body trenches 2200, 2300 are adjacent to the body region 130 and the drift region 120. Source regions 140a, 140b may be disposed adjacent to the body trenches in a similar manner as shown in FIG. 1B. According to an embodiment, at least one of the source regions 140b, 140a disposed between adjacent body trenches is disconnected from a source terminal, and the adjacent body trench implements an "inactive" trench.

According to an embodiment, a body region 130 may be connected with the source potential via a source contact portion 131. An insulating layer 2250, 2340 is disposed at sidewalls 2210, 2230, 2310, 2320 and at a bottom side 2240, 2330 of each of the body trenches 2200, 2300. A conductive layer 2260, 2350 is disposed in each of the body trenches 2200, 2300. The insulating layer 2250, 2340 in the body trenches 2200, 2300 may insulate the conductive layer 2260, 2350 from the adjacent body region 130 and drift region 120. At least one of the first and second body trenches 2200, 2300 is different from the active trench 2100.

Within the context of the present specification, the term "is different" is intended to mean that at least one of the first and second body trenches 2200, 2300 differs from the active trench 2100 with respect to shape, material(s) in the trench and electrical connection. For example, the width $w_1$, $w_2$ of at least one of the body trenches 2200, 2300 may be different from the width of the active trench 2100. This feature may alternatively or additionally mean that the depth $d_1$, $d_2$ of the first or second body trench 2200, 2300 may be different from the depth of the active trench 2100. According to a further embodiment, this feature may mean that the thickness of the insulating layer 2230, 2340 of the first or second body trench 2200, 2300 may be different from a thickness of the dielectric layer 2130 within the active trench. According to still a further embodiment, this feature may mean that the dielectric layer 2250, 2340 of the first or second body trench has a composition and, consequently, a dielectric constant that is different from that of the dielectric layer 2130 of the active trench 2100. Further, the distance between the first and the second body trenches 2200, 2300 $s_1$ may be different from a distance $s_2$ between the second body trench 2300 and the third body trench 2400. In addition, this feature may mean, that the conductive filling of the respective trenches is connected with different potentials. For example, the conductive filling 2260, 2350 of the first and the second body trenches 2200, 2300 may be connected with source potential, and the conductive layer 2450 inside the third body trench 2400 may be connected with the gate potential. According to a further embodiment, this feature may mean that the cross-sectional shape of the respective trenches is different, the cross-section being taken in a plane parallel to the first main surface of the substrate.

Further, the thicknesses of the dielectric layers 2250, 2330, 2430 at the sidewall 2210, 2310, 2410 closer to the active trench 2100, at the sidewall 2230, 2320, 2420 remote from the active trench 2100 and at the bottom side 2240, 2330, 2430 may be equal or different from each other. Further, the thicknesses $t_{2,1}$, $t_{2,2}$, $t_{2,3}$ may be equal to the thicknesses $t_{3,1}$, $t_{3,2}$, $t_{3,3}$ of the second body trench and, optionally, $t_{4,1}$, $t_{4,2}$, $t_{4,3}$ of the third body trench 2400.

According to a further embodiment, fixed charges comprising, for example, ions of Cs or Al, may be disposed in any of the active trench or the body trenches. For example, the number or kind of fixed charges may be different between any of the body trenches or may be different between at least one of the body trenches and the active trench. According to still another embodiment, the fixed charges may be present in an asymmetric manner in the body trench or in the active trench. Although not specifically illustrated in FIG. 2A, a semiconductor device may comprise several or a plurality of the discussed transistor cells disposed adjacent to each other. For example, the transistor cells may be connected parallel to each other to form a transistor cell array.

According to an embodiment, a semiconductor device 2000 comprises a drift region 120 of a first conductivity type, a body region 130 of a second conductivity type between the drift region 120 and the first main surface 110. The semiconductor device 2000 further comprises an active trench 2100 at the first main surface 110 extending into the drift region 120, a gate insulating layer 2130 at sidewalls and at a bottom side of the active trench 2100 and a gate conductive layer 2140 in the active trench 2100. The semiconductor device 2000 further comprises a source region 140 of the first conductivity type in the body region 130 adjacent to the active trench 2100 and a first body trench 2200 at the first main surface 110 extending into the drift region 120, the body trench 2200 being adjacent to the body region 130 and to the drift region 120. An insulating layer 2250 is disposed at sidewalls and at a bottom side of the body trench 2200, the insulating layer 2250 having a larger thickness than a thickness of the gate insulating layer 2130. Further, a conductive layer 2260 is disposed in the body trench 2200. In the context of the present specification, the term "the insulating layer has a larger thickness" is intended to mean that, if for example, the insulating layer has a homogenous layer thickness, any thickness of the gate insulating layer, e.g. measured at the bottom side or at sidewalls of the active trench 2100 is smaller than the thickness of insulating layer. If the thickness of the insulating layer varies, for example, the thickness at sidewalls is different from the thickness at the bottom side, the corresponding portions of the insulating layers have to be compared. For example, at the bottom side, the gate insulating layer has a smaller thickness than the insulating layer and at the sidewalls the gate insulating layer has a smaller than the insulating layer.

FIG. 2B shows a cross-sectional view of a semiconductor device according to a further embodiment. In FIG. 2B the same reference numerals designate the same elements as in FIG. 2A. In contrast to the embodiment shown in FIG. 2A, the body trenches 2200, 2300 include a conductive material 2260, 2350 that is connected with the source terminal and the body trenches 2200, 2300 may be identical. The body trench 2400 includes a conductive material 2450 that is connected with the gate terminal is and trench 2400 is different from the other body trenches. In the context of the present embodiment, the term "is different" has the same meaning as defined above. For example the body trench 2400 that is connected with the gate terminal may have a deeper depth than the body trenches 2200, 2300 that are connected with the source terminal. In sum, according to this embodiment, the body trenches that are connected to a first terminal are identical, and body trenches that are connected to a second terminal different from the first terminal, are different from the body trenches connected to the first terminal.

The semiconductor device 2000 of FIG. 2A further comprises similar components as the semiconductor device shown in FIGS. 1A and 1B, these components being designated by corresponding reference numerals.

According to a further embodiment, a semiconductor device comprises a transistor cell, and the transistor cell includes a drift region 120 of a first conductivity type, a body region 130 of a second conductivity type, the body region 130 being disposed between the drift region 120 and the first main surface 110. The transistor cell comprises an active trench 2100 that is formed in the first main surface 110 and that extends to the drift region 120, a gate conductive layer 1140 being disposed in the active trench 2100. The transistor cell further comprises a source region 140 of the first conductivity type, formed in the body region 130 adjacent to the active trench 2100. The transistor cell further comprises at least a first and a second body trench 2200, 2300 and, optionally, a third trench 2400 or even more body trenches formed in the first main surface 110 and extending to the drift region 120. The body trenches 2200, 2300 are adjacent to the body region 130 and the drift region 120. An insulating layer 2250, 2340 is disposed at sidewalls 2210, 2230, 2310, 2320 and at a bottom side 2240, 2330 of each of the body trenches 2200, 2300. A conductive layer 2260, 2350 is disposed in each of the body trenches 2200, 2300. The first body trench 2200 may be different from the second body trench 2300. Moreover, the third body trench 2400 is different from at least one of the first and second body trenches 2200, 2300. For example, the semiconductor device 2000 may be an Insulated Gate Bipolar Transistor (IGBT).

The feature "is different" as used within the context of this embodiment has the same meaning as explained above.

Example 1

Simulations have been performed for an IGBT that is designed to withstand a voltage of 1200 V and in which the thickness of the dielectric layer ($SiO_2$) in the active trench is 100 nm, whereas the thickness of the dielectric layer ($SiO_2$) of the first, second and third body trenches is 300 nm. Lines of equal potential have been determined for a gate voltage of 0 V and a voltage between source electrode 145 and back side electrode 180 of $V_{ce}$=600 V. The source region 140 and the drift region 120 are n-doped, whereas the body region 130 and the back side region 160 are p-doped. The conductive layer 2260, 2350, 1450 of the first, second and third body trenches 2200, 2300, 2400 is connected with the source potential (0 V). The distribution of lines of equal potential in the IGBT according to this example shows that, due to the thicker oxide layer in the body trenches, the potential between the body trenches is shifted to more positive values.

As such, an increase of the gate-feedback is realized in comparison to an IGBT of a reference example. The increased gate-feedback results in improved electrical characteristics which will be discussed below. According to this reference example, the thickness of the silicon oxide layer in each of the first, second and third body trenches is equal to the thickness of the silicon oxide layer in the active trench, for example 100 nm. The further structure of the IGBT according to the reference example is similar to the structure of the IGBT of Example 1 except for the thickness of the dielectric layer in the body trenches.

Figure 3A:
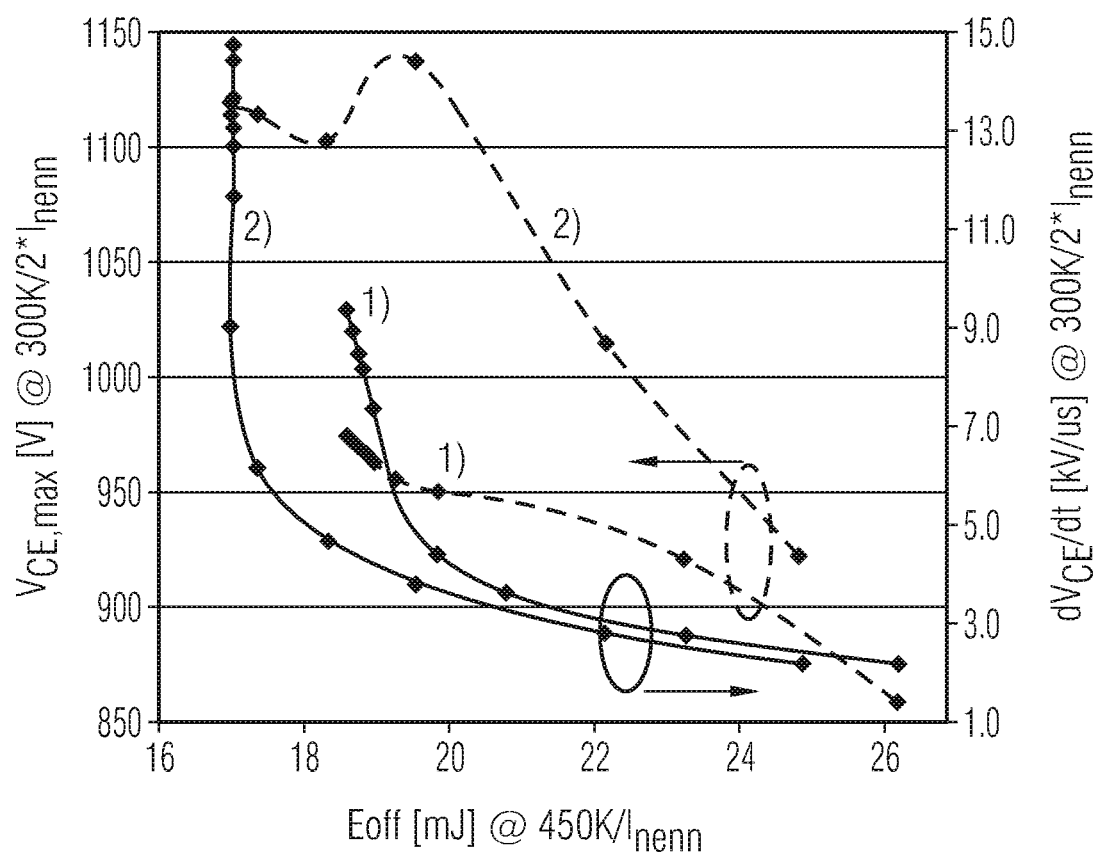

FIG. 3A illustrates on the left-hand axis the simulated maximum overvoltage $V_{ce,max}$ between back side electrode 180 and source electrode 145 in dependence from the switch-off energy $E_{off}$. The different points represent the overvoltage determined at different gate resistivities between 0 and 200 Ohm. The maximum overvoltage $V_{CE,max}$ between back side electrode 180 and source electrode 145 is a measure for the maximum gradient of the back side electrode current $dI_c/dt$, wherein curve 1) of the solid lines denotes the characteristics of the IGBT according to example 1, whereas curve 2) of the solid lines denotes the characteristics of an IGBT according to a comparative example. As can be seen from a comparison of curve 1) with curve 2), a voltage spike occurs in curve 2) whereas no voltage spike occurs in curve 1).

The right-hand axis of FIG. 3A denotes the steepness of the simulated voltage ($dV_{ce}/dt$) when switching off as a function of the switch-off energy $E_{off}$. In a similar manner as in FIG. 3A, the different points represent the overvoltage determined at different gate resistivities between 0 and 200 Ohm. As can be seen from a comparison of curve 1) with curve 2) of the broken lines, the current gradient may be better adjusted using the IGBT structure of example 1 than according to the comparative example.

Figure 3B:
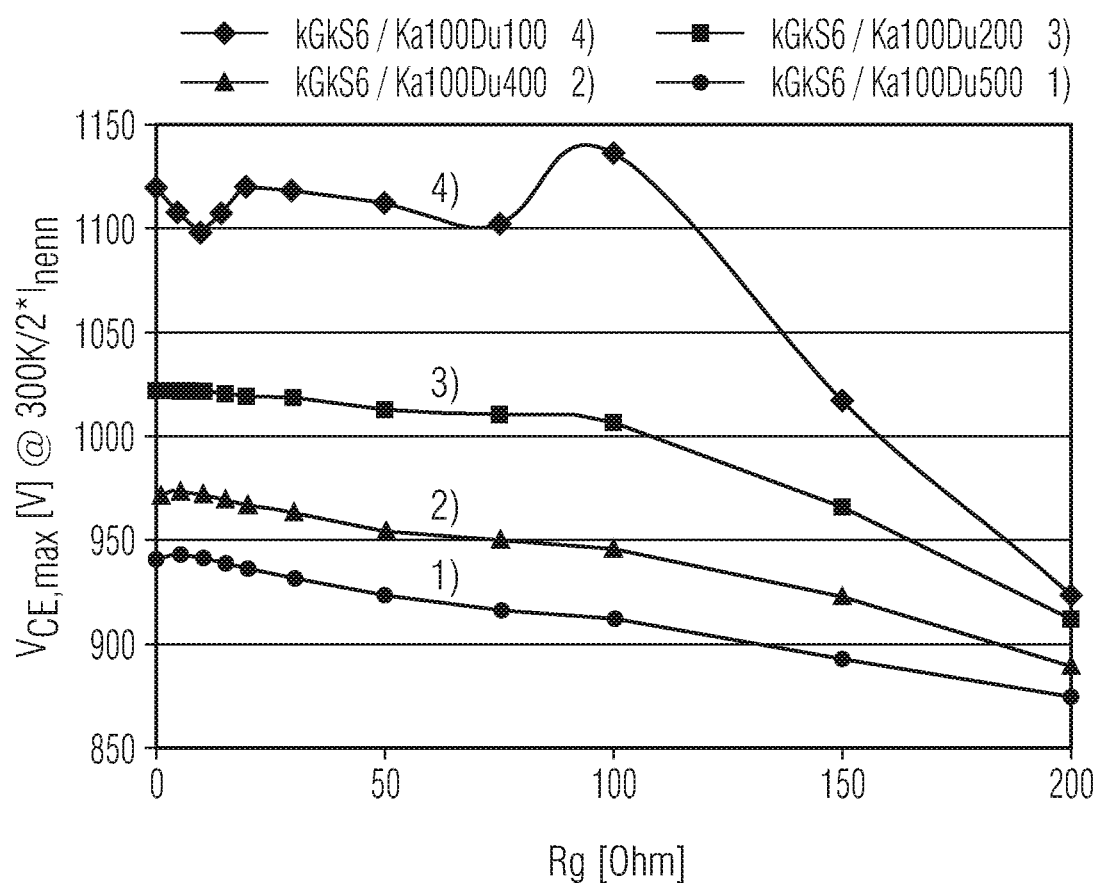

FIG. 3B illustrates a simulation result of $V_{ce,max}$ depending on the gate resistivity for different thicknesses of the silicon oxide within the first, second and third body trenches. In FIG. 3B, curve 1) denotes the result for a thickness of the insulating layer in the body trenches of 500 nm, curve 2) denotes the result for a thickness of the insulating layer in the body trenches of 400 nm, curve 3) denotes the result for a thickness of the insulating layer in the body trenches of 200 nm, and curve 4) denotes the result for a thickness of the insulating layer in the body trenches of 100 nm. As can be seen from FIG. 3B, the overvoltage of the IGBT can be adjusted by adjusting the thickness of the oxide layer within the body trenches.

FIG. 3C shows a further simulation of $dV_{ce}/dt$ when turning off as a function of the gate resistance for the IGBT having different thicknesses of the oxide layer in the body trenches. Curve 1) denotes the result for a thickness of the insulating layer in the body trenches of 500 nm, curve 2) denotes the result for a thickness of the insulating layer in the body trenches of 400 nm, curve 3) denotes the result for a thickness of the insulating layer in the body trenches of 200 nm, and curve 4) denotes the result for a thickness of the insulating layer in the body trenches of 100 nm. As can be seen in FIG. 3C, the overvoltage between back side electrode 180 and source electrode 145 can be better adjusted at low gate resistances by increasing the thickness of the oxide layer within the body trenches.

Figure 4A:
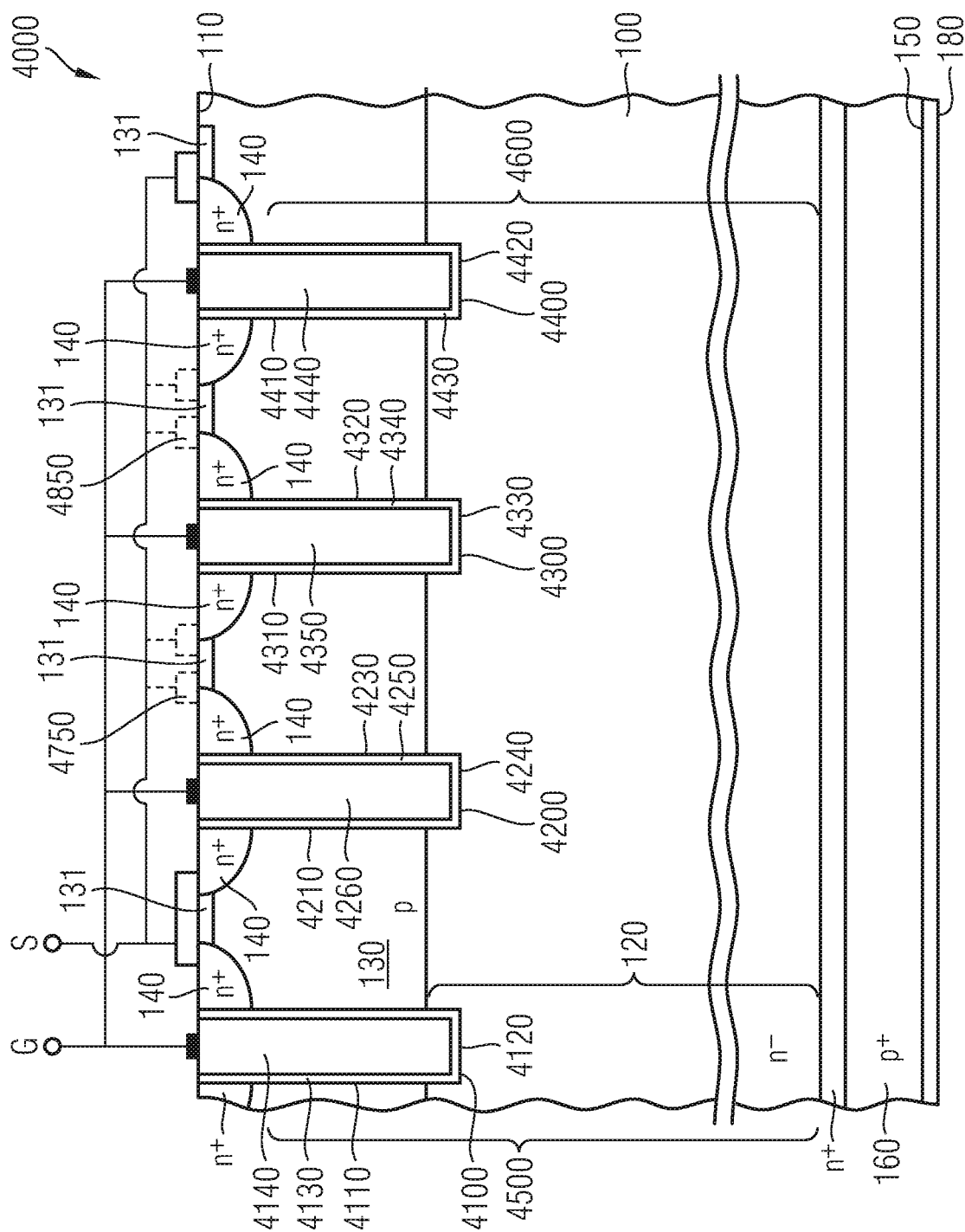

FIG. 4A shows a semiconductor device according to a further embodiment. The semiconductor device 4000 according to the embodiment shown in FIG. 4A is formed in a semiconductor substrate 100 including a first main surface 110 and a second main surface 150, the second main surface 150 opposite to the first main surface 110. The semiconductor device 4000 comprises a drift region 120 of a first conductivity type, a body region 130 of a second conductivity type, the body region 130 disposed between the drift region 120 and the first main surface 110. The semiconductor device 4000 additionally comprises a first transistor cell 4500 and a second transistor cell 4600. Each of the transistor cells 4500, 4600 comprise an active trench 4100, 4400 that is formed in the first main surface 110 and that extends to the drift region 120. The semiconductor transistor cells 4500, 4600 further comprise active source regions 140 of the first conductivity type. A gate conductive layer 4140, 4440 is disposed in the active trench 4100, 4400 and the active source regions 140 are disposed in the body region 130 adjacent the active trench 4100, 4400. The semiconductor device 4000 further comprises a plurality of further gate trenches disposed between the first and the second transistor cells, and further source regions 140 of the first conductivity type are disposed adjacent to the further gate trenches. Although FIG. 4A shows only two further gate trenches 4200, 4300, the number of further gate trenches may be more than two.

The further gate trenches 4200, 4300 and the active trenches 4100, 4400 are connected with a gate potential. At least one of the further source regions, 140 is not connected with the source potential. Accordingly, the semiconductor device comprises so-called inactive gate trenches 4200, 4300 at which no conductive channel is formed in case of an on-voltage being applied to the gate electrode.

Due to the special structure illustrated in FIG. 4A, by arbitrarily connecting any of the source contacts 4750, 4850 with the source potential, the channel width of the semiconductor device 4000 may be changed and, thus, the characteristics of the semiconductor device may be adjusted. According to an embodiment, the trenches 4200, 4300, and 4400 may be identical to each other and to the active trench 4100. According to a further embodiment, at least one of the trenches 4200, 4300, and 4400 may be different from the other trenches of from the active trench 4100. In this context, the term "is different" has the same meaning as explained above.

FIG. 4B shows a further embodiment of a semiconductor device. The semiconductor device comprises a first transistor cell 4500 and a second transistor cell 4600. In addition to the embodiment shown in FIG. 4A, the semiconductor device 4000 further comprises at least one body trench 4700 that may be connected with source potential. The further components of the semiconductor device of FIG. 4B are similar to respective components of the semiconductor device of FIG. 4A. Accordingly, each of the first and second transistor cells 4500, 4600 comprises an active trench 4100, 4400 being formed in the first main surface and extending to the drift region 120. A gate conductive layer 4140, 4440 is disposed in the active trench 4100, 4400 and the source regions 140 are formed in the body region 130 adjacent to the active trenches 4100, 4400. The semiconductor device 4000 further comprises a first and a second body trench 4200, 4700, disposed between the first and the second transistor cells 4500, 4600, the first and the second body trenches 4200, 4700 formed in the first main surface 110 and extending to the drift region 120. Optionally, further body trenches 4300 may be disposed between the first and the second transistor cells 4500, 4600. The body trenches 4200, 4300, 4700 are adjacent to the body region 130 and the drift region 120. The conductive material 4260, 4350, 4740 in each of the trenches 4200, 4300, 4700 is insulated from adjacent semiconductor material by means of the insulating layer 4250, 4340, 4730. The first body trench 4200 is connected with a source potential, and the second body trench 4700 is connected with the gate potential. According to embodiments, some or all of the contacts 4270, 4370, 4470, 4570 may be connected with the source potential. Further, the contacts 4270, 4370, 4470, 4570 may be arranged so as to contact the respective body contacts 131 and, optionally, additionally the source regions. Thereby, the effective channel width of the transistor may be further influenced.

According to an embodiment, the body trenches further from the active trench 4100 than other body trenches are connected with the gate potential, whereas those body trenches disposed close to the active trench are connected with the source potential. As such, the current feed-back to the gate potential may be further decreased since the lateral current flow at a depth corresponding to the depth of the bottom of the trenches is concentrated in the vicinity of the active gate trenches and mainly flows under body trenches that are held at source potential.

The body trenches 4200, 4300 and 4700 may be identical to each other and may be identical to the active trench 4100. According to a further embodiment, the body trenches 4200, 4300 and 4700 may be identical to each other and may be different from the active trench 4100. Further, at least one of the body trenches 4200, 4300 and 4700 may be different from the other body trenches. For example, the body trench 4700, that is connected with the gate terminal, may be different from the other body trenches 4200, 4300 that are connected with the source terminal. For example, the body trench 4700 may extend to a deeper depth than the other body trenches 4200, 4300. The body trench 4700 may be identical with or different from the active trench 4100. In this context, the term "is different" has the same meaning as explained above.

According to the embodiment illustrated in FIGS. 4A and 4B, a semiconductor device 4000 formed in a semiconductor substrate 100 includes a first main surface 110 and comprises a drift region 120 of a first conductivity type, a body region 130 of a second conductivity type, the body region 130 disposed between the drift region 120 and the first main surface 110, a first transistor cell 4500 and a second transistor cell 4600, each of the first and second transistor cells 4500, 4600 comprising an active trench 4100, 4400 at the first main surface 110 and extending into the drift region 120, a gate conductive layer 4140, 4440 disposed in the active trench 4100, 4400, and a source region 140 formed in the body region 130 adjacent to the active trench 4100, 4400. The semiconductor device further comprises body trenches 4200, 4300, 4700 disposed between the first 4500 and the second transistor cells 4600 and further source regions 140, the body trenches 4200, 4300, 4700 formed in the first main surface 110 and extending into the drift region 120, the body trenches 4200, 4300, 4700 adjacent to the body region 130 and the drift region 120. A conductive material in at least one of the body trenches 4200, 4300, 4700 is connected with a gate terminal and at least one of the further source regions 140 disposed between the body trenches being disconnected from a source terminal.

Example 2

The semiconductor device according to Example 2 comprises a transistor cell including a first, a second and a third body trench, so that six body trenches are disposed between two active trenches. The first and second body trenches are held at source potential, and the third body trench is held at gate potential. According to a reference example, the first, second and third body trenches are held at source potential.

Figure 5A:
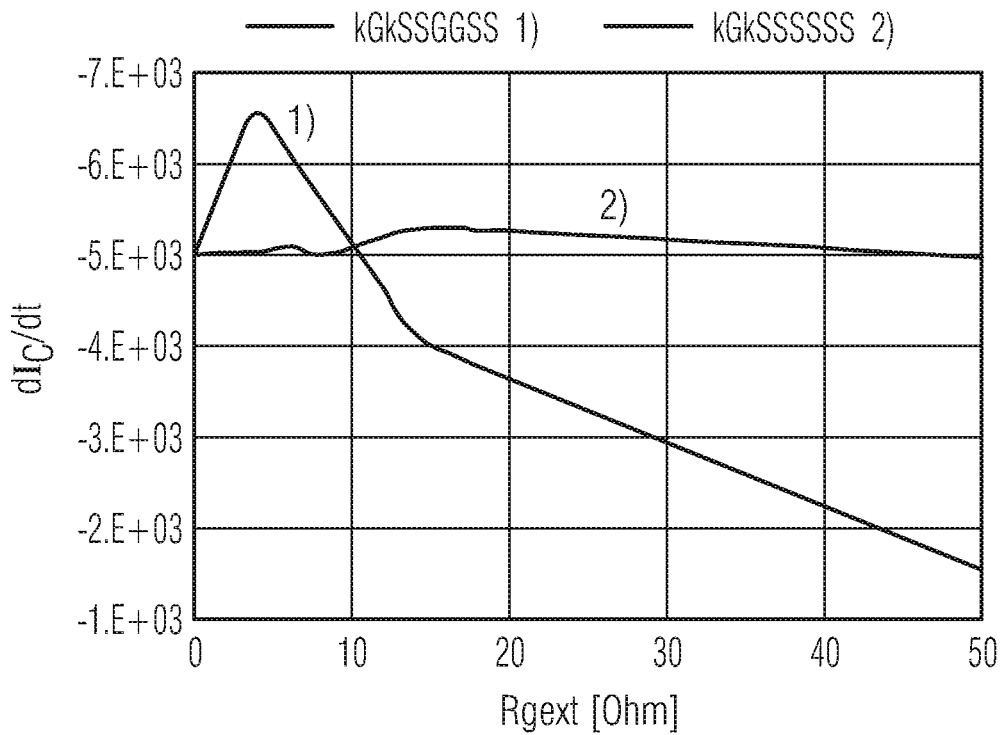
FIGS. 5A and 5B show simulation results obtained for the semiconductor device illustrated in FIG. 4.
Figure 5B:
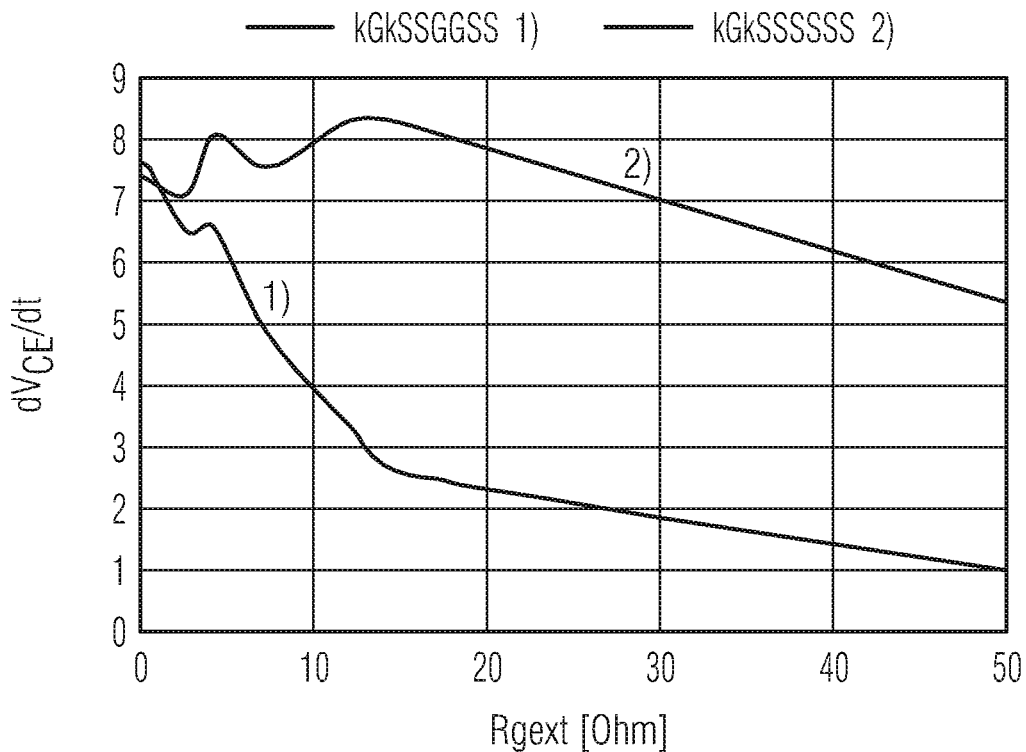

FIGS. 5A and 5B show results of simulations of an IGBT according to example 2 in comparison with a reference example. FIG. 5A shows the maximum gradient of the current $dI_c/dt$ as a cause of the maximum overvoltage $V_{CE,max}$ between back side electrode 180 and source electrode 145 as a function of the external gate resistance. As seen in curve 1) the simulation result of Example 2 in comparison with curve 2), 1) is better controllable in terms of maximum $dI_c/dt$.

FIG. 5B shows the maximum steepness of the voltage $dV_{ce}/dt$ during switch off as a function of the gate resistance. As can be recognized from FIG. 5B, the voltage gradient may be better adjusted by adjusting the gate resistance according to example 2 (curve 1) in comparison to the reference example (curve 2).

As a result, when using an IGBT according to an embodiment, by adjusting the gate resistance, the switching behaviour of the IGBT may be adjusted according to the specific needs without changing the channel length.

As has been shown, according to embodiments, the current gradient and the voltage gradient can be better adjusted by setting a corresponding gate resistance. As a consequence, it is possible to adapt the switching behaviour of the semiconductor device to the specific needs of special applications by setting a corresponding value of a series-resistance connected with the gate electrode.

The shown cross-sections views of the semiconductor devices or IGBTs illustrate only a part of an IGBT cell array. As an example, a geometry of the IGBT cells may be in the form of stripes including the several trenches extending parallel to each other in a direction perpendicular to the depicted plane of the cross-sectional views. According to further embodiments, the trenches may form different patterns.

While embodiments of the invention have been described above, it is obvious that further embodiments may be implemented. For example, further embodiments may comprise any sub-combination of features recited in the claims or any sub-combination of elements described in the examples given above. Accordingly, this spirit and scope of the appended claims should not be limited to the description of the embodiments contained herein.

What is claimed is:

1. A semiconductor device, comprising:
a semiconductor substrate having a first main surface and a second main surface opposite the first main surface;
a first region of a first conductivity type formed in the semiconductor substrate;
a second region of a second conductivity type opposite the first conductivity type formed in the semiconductor substrate above the first region;
a third region of the second conductivity type formed in the semiconductor substrate adjacent to the second main surface;
an active gate trench extending from the first main surface and into the second region, the active gate trench including a first electrode coupled to a gate potential;
a fourth region of the first conductivity type formed in the second region adjacent to the gate trench and coupled to an electric potential different than the gate potential;
a first body trench extending from the first main surface and into the second region, the first body trench including a second electrode coupled to the electric potential different than the gate potential; and
an inactive gate trench extending from the first main surface and into the second region, the inactive gate trench including a third electrode coupled to the gate potential,
wherein a conductive channel is present along the active gate trench in case of the gate potential being at an on-voltage of the semiconductor device, wherein no conductive channel is present along the inactive gate trench in case of the gate potential being at the on-voltage.

2. The semiconductor device of claim 1, wherein a distance between the first body trench and the active gate trench is smaller than a distance between the inactive gate trench and the active gate trench.

3. The semiconductor device of claim 1, further comprising a gate insulating layer at sidewalls and at a bottom side of the active gate trench, wherein a thickness of the gate insulating layer is smaller than a thickness of an insulating layer in the first body trench and/or the inactive gate trench.

4. The semiconductor device of claim 1, further comprising an insulating layer at sidewalls and at a bottom side of the first body trench, the insulating layer being asymmetric with respect to an axis extending perpendicular to the first main surface at a center of the first body trench.

5. The semiconductor device of claim 4, wherein a thickness of the insulating layer in the first body trench on a sidewall adjacent the active gate trench is different from the thickness of the insulating layer on the sidewall remote from the active gate trench.

6. The semiconductor device of claim 4, wherein a composition of the insulating layer in the first body trench at a sidewall adjacent the active gate trench is different from the composition of the insulating layer at the sidewall remote from the active gate trench.

7. The semiconductor device of claim 1, further comprising additional body trenches, the additional body trenches being different from the active gate trench.

8. The semiconductor device of claim 7, wherein an insulating layer is disposed in each of the additional body trenches, and wherein a thickness of the insulating layer disposed in the additional body trenches is different from a thickness of a gate insulating layer in the active gate trench.

9. The semiconductor device of claim 7, wherein a first thickness of the insulating layer in one of the additional body trenches at a sidewall adjacent the active gate trench is different from a second thickness of the insulating layer at the sidewall remote from the active gate trench, wherein the first thickness is approximately equal to a thickness of a gate insulating layer in the active gate trench, and wherein the second thickness is approximately equal to the thickness of the insulating layer in the additional body trenches.

10. The semiconductor device of claim 7, wherein the additional body trenches each include an electrode coupled to the electric potential different than the gate potential.

11. The semiconductor device of claim 1, further comprising an electrode in contact with the third region.

12. The semiconductor device of claim 1, wherein a first portion of the first region adjoins the second region and a second portion of the first region adjoins the third region, and wherein the first portion has a lower impurity concentration than the second portion.

13. A semiconductor device, comprising:
a semiconductor substrate having a first main surface and a second main surface opposite the first main surface;
a first region of a first conductivity type formed in the semiconductor substrate;
a second region of a second conductivity type opposite the first conductivity type formed in the semiconductor substrate above the first region;
a third region of the second conductivity type formed in the semiconductor substrate adjacent to the second main surface; and
a transistor cell comprising:
an active gate trench extending from the first main surface and into the second region, the active gate trench including a first electrode coupled to a gate potential;
a fourth region of the first conductivity type formed in the second region adjacent to the gate trench and coupled to an electric potential different than the gate potential;
a first body trench extending from the first main surface and into the second region, the first body trench including a second electrode coupled to the electric potential different than the gate potential; and
an inactive gate trench extending from the first main surface and into the second region, the inactive gate trench including a third electrode coupled to the gate potential,
wherein a conductive channel of the transistor cell is present along the active gate trench in case of the gate potential being at an on-voltage of the semiconductor device,
wherein no conductive channel of the transistor cell is present along the inactive gate trench in case of the gate potential being at the on-voltage.

14. The semiconductor device of claim 13, wherein a distance between the first body trench and the active gate trench of the transistor cell is smaller than a distance between the inactive gate trench and the active gate trench of the transistor cell.

15. The semiconductor device of claim 13, wherein the transistor cell further comprises a gate insulating layer at sidewalls and at a bottom side of the active gate trench, and wherein a thickness of the gate insulating layer is smaller than a thickness of an insulating layer in the first body trench and/or the inactive gate trench of the transistor cell.

16. The semiconductor device of claim 13, wherein the transistor cell further comprises an insulating layer at sidewalls and at a bottom side of the first body trench, and wherein the insulating layer is asymmetric with respect to an axis extending perpendicular to the first main surface at a center of the first body trench.

17. The semiconductor device of claim 16, wherein a thickness of the insulating layer in the first body trench on a sidewall adjacent the active gate trench of the transistor cell is different from the thickness of the insulating layer on the sidewall remote from the active gate trench of the transistor cell.

18. The semiconductor device of claim 16, wherein a composition of the insulating layer in the first body trench at a sidewall adjacent the active gate trench of the transistor cell is different from the composition of the insulating layer at the sidewall remote from the active gate trench of the transistor cell.

19. The semiconductor device of claim 13, wherein the transistor cell further comprises additional body trenches, and wherein the additional body trenches are different from the active gate trench of the transistor cell.

20. The semiconductor device of claim 19, wherein the transistor cell comprises an insulating layer disposed in each of the additional body trenches, and wherein a thickness of the insulating layer disposed in the additional body trenches is different from a thickness of a gate insulating layer in the active gate trench of the transistor cell.

21. The semiconductor device of claim 19, wherein a first thickness of the insulating layer in one of the additional body trenches at a sidewall adjacent the active gate trench of the transistor cell is different from a second thickness of the insulating layer at the sidewall remote from the active gate trench of the transistor cell, wherein the first thickness is approximately equal to a thickness of a gate insulating layer in the active gate trench of the transistor cell, and wherein the second thickness is approximately equal to the thickness of the insulating layer in the additional body trenches of the transistor cell.

22. The semiconductor device of claim 19, wherein the additional body trenches of the transistor cell each include an electrode coupled to the electric potential different than the gate potential.

23. The semiconductor device of claim 13, further comprising an electrode in contact with the third region.

24. The semiconductor device of claim 13, wherein a first portion of the first region adjoins the second region and a second portion of the first region adjoins the third region, and wherein the first portion has a lower impurity concentration than the second portion.

* * * * *